(12) United States Patent
Tian et al.

(10) Patent No.: US 11,340,664 B2
(45) Date of Patent: May 24, 2022

(54) DISPLAY DEVICE AND MANUFACTURING METHOD THEREOF

(71) Applicant: BOE TECHNOLOGY GROUP CO., LTD., Beijing (CN)

(72) Inventors: Hongwei Tian, Beijing (CN); Yanan Niu, Beijing (CN); Dong Li, Beijing (CN); Chunyang Wang, Beijing (CN); Zheng Liu, Beijing (CN); Ming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 74 days.

(21) Appl. No.: 16/637,426

(22) PCT Filed: Jan. 17, 2019

(86) PCT No.: PCT/CN2019/072211
§ 371 (c)(1),
(2) Date: Feb. 7, 2020

(87) PCT Pub. No.: WO2020/147079
PCT Pub. Date: Jul. 23, 2020

(65) Prior Publication Data
US 2021/0232186 A1    Jul. 29, 2021

(51) Int. Cl.
*G06F 1/16* (2006.01)
(52) U.S. Cl.
CPC .......... *G06F 1/1698* (2013.01); *G06F 1/1652* (2013.01)
(58) Field of Classification Search
CPC ....... G06F 1/1698; G06F 1/1652; H01L 27/32
See application file for complete search history.

(56) References Cited

U.S. PATENT DOCUMENTS

| 9,728,840 | B2 | 8/2017 | Shi et al. |
| 9,881,947 | B2 | 1/2018 | He et al. |
| 10,290,239 | B2 | 5/2019 | Liu |
| 2014/0176819 | A1* | 6/2014 | Yilmaz ................. G06F 3/0446 349/12 |
| 2017/0045918 | A1 | 2/2017 | Han et al. |
| 2017/0162821 | A1* | 6/2017 | Oh ....................... H01L 51/5256 |
| 2018/0034130 | A1 | 2/2018 | Jang |
| 2018/0069588 | A1* | 3/2018 | Jiang ....................... G06F 1/163 |

FOREIGN PATENT DOCUMENTS

| CN | 102931199 A | 2/2013 |
| CN | 104485334 A | 4/2015 |
| CN | 105446526 A | 3/2016 |
| CN | 106898264 A | 6/2017 |
| CN | 107665914 A | 2/2018 |
| KR | 20180052476 A | 5/2018 |

OTHER PUBLICATIONS

First Office Action from Chinese Patent Application No. 201980000084.X dated Apr. 12, 2022.

* cited by examiner

*Primary Examiner* — Rockshana D Chowdhury
(74) *Attorney, Agent, or Firm* — Dilworth & Barrese, LLP.; Michael J. Musella, Esq.

(57) ABSTRACT

A display device and a manufacturing method thereof are provided. The display device includes: a flexible substrate including a display portion and a back portion that are connected with each other, the display portion including a display side and a back side opposite to the display side, the back portion being located at the back side of the display portion; and an antenna located on the back portion.

13 Claims, 10 Drawing Sheets

DISPLAY DEVICE AND MANUFACTURING METHOD THEREOF

TECHNICAL FIELD

At least one embodiment of the present disclosure relates to a display device and a manufacturing method thereof.

BACKGROUND

Near Field Communication (NFC) is an emerging technology. Devices using the NFC technology (such as mobile phones) can exchange data when they are close to each other. It evolves from integration of non-contact radio frequency identification (RFID) and interconnection technologies. By integrating functions of an inductive card reader, an inductive card and point-to-point communication on a single chip, mobile terminals are utilized for achieving mobile payment, electronic ticket business, access control, mobile identity recognition, anti-counterfeiting, transmission of product information in supermarkets or stores, etc. For example, NFC is a wireless communication technology used for secure communication at a short distance (less than 10 cm), with a working frequency of about 13.56 MHz. NFC is composed of an initiator and a receiver.

In a historical trend of the Internet of Things (IOT) and the Internet of Everything (IOE), secure and fast information exchange and screening are very urgent and core need, and the NFC technology can better meet this need. At present, related NFC services such as mobile phone payment on buses and subways have been provided in various places throughout the country, which proves that this trend is accelerating ceaselessly.

SUMMARY

At least one embodiment of the present disclosure relates to a display device and a manufacturing method thereof.

At least one embodiment of the present disclosure provides a display device, which includes: a flexible substrate, including a display portion and a back portion that are connected with each other, the display portion including a display side and a back side opposite to the display side, the back portion being located at the back side of the display portion; and an antenna, located on the back portion.

In some embodiments of the present disclosure, the flexible substrate further includes a curved portion, the display portion is connected with the back portion by the curved portion, and the display portion, the curved portion and the back portion constitute an integral structure.

In some embodiments of the present disclosure, the antenna includes at least one coil.

In some embodiments of the present disclosure, the at least one coil is located at a side of the back portion away from the display portion.

In some embodiments of the present disclosure, the at least one coil is in direct contact with the flexible substrate.

In some embodiments of the present disclosure, a spacer layer is provided at a side of the at least one coil close to the back portion, and the at least one coil is in direct contact with the spacer layer.

In some embodiments of the present disclosure, the spacer layer is made from at least one selected from the group consisting of an insulation material and a semiconductor material.

In some embodiments of the present disclosure, the antenna includes two coils located at a side of the back portion close to the display portion and a side of the back portion away from the display portion, respectively.

In some embodiments of the present disclosure, the antenna includes two coils located at a same side of the back portion.

In some embodiments of the present disclosure, an insulation layer is provided between the two coils.

In some embodiments of the present disclosure, the display device further includes a plurality of display units located on the display portion, each of the plurality of display units includes a thin film transistor, the thin film transistor includes a gate electrode and a source-drain electrode layer, one of the two coils is made of a same material as that of the gate electrode through a same process as that of the gate electrode, and the other one of the two coils is made of a same material as that of the source-drain electrode layer through a same process as that of the source-drain electrode layer, and an insulation layer is provided between the two coils.

In some embodiments of the present disclosure, the back portion further includes a pad region, the pad region includes a plurality of leads connected with the plurality of display units respectively, and the antenna is located in a region of the back portion except the pad region.

In some embodiments of the present disclosure, the two coils are arranged at two opposite sides of the pad region, respectively.

In some embodiments of the present disclosure, the antenna further includes two connection wires connected with two ends of a same coil of the at least one coil, respectively, and the two connection wires are configured to be connected with an external circuit.

In some embodiments of the present disclosure, the two connection wires and the coil are located at a same side of the back portion.

In some embodiments of the present disclosure, the back portion includes two via holes, the two connection wires are arranged in a same layer, the coil or the two connection wires are located at a side of the back portion close to the display portion, the two connection wires or the coil is located at a side of the back portion away from the display portion, and the two connection wires are connected with two ends of the coil through the two via holes, respectively.

In some embodiments of the present disclosure, a material of the coil includes a metal or an alloy, and the metal or the alloy includes at least one selected from the group consisting of molybdenum, silver, aluminum and copper.

In some embodiments of the present disclosure, the antenna includes an NFC antenna.

At least one embodiment of the present disclosure further provides a manufacturing method of a display device, which includes: forming an antenna on a first portion of a flexible substrate, the first portion being a portion of the flexible substrate to form a back portion, the flexible substrate including a display portion, the display portion including a display side and a back side opposite to the display side; and bending a portion of the flexible substrate located between the display portion and the first portion so that the first portion is bent to the back side of the display portion to form the back portion.

In some embodiments of the present disclosure, forming the antenna on the first portion includes: forming at least one coil on the first portion.

In some embodiments of the present disclosure, the manufacturing method further includes forming a plurality of display units on the display portion of the flexible substrate, the at least one coil and the plurality of display units are formed at a same side of the flexible substrate before being bent.

In some embodiments of the present disclosure, forming the plurality of display units on the display portion includes forming a gate electrode and a source-drain electrode layer of a thin film transistor of each of the plurality of display units on the display portion, and forming the antenna on the first portion includes forming a first coil and a second coil on the first portion, forming the gate electrode and the source-drain electrode layer on the display portion and forming the first coil and the second coil on the first portion includes: forming a gate electrode material layer on the display portion and on the first portion of the flexible substrate; patterning the gate electrode material layer to form the gate electrode on the display portion and form the first coil on the first portion; forming a gate electrode insulation layer on the gate electrode and on the first coil; forming a source-drain electrode material layer on the gate electrode insulation material layer; and patterning the source-drain electrode material layer so as to form the source-drain electrode layer on the display portion and form the second coil on the first portion.

In some embodiments of the present disclosure, forming the antenna on the first portion includes: forming a first coil and a second coil at two sides of the first portion, respectively.

In some embodiments of the present disclosure, forming the antenna on the first portion includes: forming two coils at a same side of the first portion.

In some embodiments of the present disclosure, forming the antenna on the first portion further includes: forming two connection wires located in a same layer on the first portion; forming at least one coil on the first portion and forming the two connection wires on the first portion includes: forming two via holes penetrating the first portion; forming the two connection wires on the first portion; and forming a first coil at a side of the first portion opposite to a side where the two connection wires are formed, the two connection wires being connected with two ends of the first coil, respectively.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

An inventor of the present application observes that an antenna of a mobile phone is often manufactured separately by means of a Flexible Printed Circuit Board (FPCB) and the like. For example, an FPCB antenna assembly is connected with a mainboard through a spring sheet. On one hand, the cost of accessories is greatly increased; and on the other hand, a size of a mobile phone itself is also affected to some extent.

Figure 1:
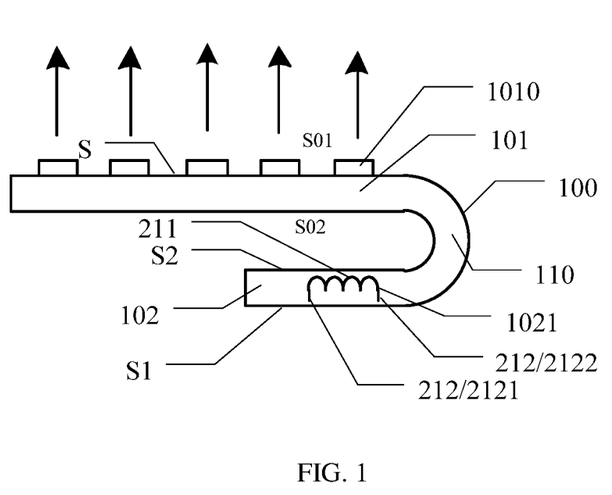
FIG. 1 is a schematic diagram illustrating a flexible display device provided by at least one embodiment of the present disclosure.

FIG. 1 is a schematic diagram illustrating a display device provided by at least one embodiment of the present disclosure. As illustrated in FIG. 1, the display device includes a flexible substrate 100. The flexible substrate 100 includes a display portion 101 and a back portion 102. The display portion 101 includes a display side S01 and a back side S02 opposite to the display side S01. The back portion 102 is located at the back side S02 of the display portion 101. As illustrated in FIG. 1, the display portion 101 is connected with the back portion 102. As illustrated in FIG. 1, the display device further includes an antenna 1021. The antenna 1021 is located on the back portion 102. The back portion 102 is obtained by bending the flexible substrate 100.

As illustrated in FIG. 1, the display device further includes a plurality of display units 1010, and the plurality of display units 1010 are located on the display portion 101. For example, the display unit 1010 may include an organic light-emitting diode (OLED), without limited thereto. For example, the display side is an image displaying side of the display device. For example, the display side is a side where a light-exiting surface S of the display device is located. The back portion 102 is a portion of the flexible substrate bent to the back side S02 of the display portion 101. The antenna 1021 can transmit and/or receive a signal.

In the display device provided by the embodiment of the present disclosure, the antenna 1021 is located on the back portion 102, and does not occupy any space of the display portion 101, which can facilitate achieving a narrow frame. Besides, because being integrated on the back portion 102 of the flexible substrate, the antenna 1021 is less restricted by area, and meanwhile can also be better connected with an exterior, so that a total cost of the display device can be lowered very well, and it is beneficial to achieve lightness and thinness of the display device itself.

In FIG. 1, the plurality of display units 1010 are located on the display side S01 of the display portion 101. In other embodiments of the present disclosure, the plurality of display units 1021 can also be located at the back side S02 of the display portion 101. That is, compared with a structure as illustrated in FIG. 1, the display side S01 and the back side S02 are unchangeable, but the plurality of display units 1010 are adjusted to be located at the back side S02 of the display portion 101. In FIG. 1, the back portion 102 is located at a side of the display portion 101 not provided with the plurality of display unit 1010, and in other embodiments, the back portion 102 can also be located at a side of the display portion 101 provided with the plurality of display units 1010.

As illustrated in FIG. 1, the back portion 102 may be obtained by bending one side of the flexible substrate 100 to the back side S02 of the display portion 101. The flexible substrate 100 further includes a curved portion 110. For example, the back portion 102 is overlapped with the display portion 101 in a direction perpendicular to the light-exiting surface S. For example, the back portion 102 is located at a side opposite to the display side S01 of the display portion 101.

As illustrated in FIG. 1, the back portion 102 is connected with the display portion 101 by the curved portion 110. The antenna 1021 is located on the back portion 102. Because the antenna 1021 is located on the back portion 102, the antenna 1021 can have a flexible and sufficient arrangement space. For example, in order to avoid influences caused by bending on the antenna, the antenna may be not arranged on the curved portion 110, without limited thereto.

In the embodiment of the present disclosure, the display portion 101 and the back portion 102 of the flexible substrate 100 are formed integrally, for example, the display portion 101, the back portion 102 and the curved portion 110 of the flexible substrate 100 constitute an integral structure. In order to facilitate description, the flexible substrate 100 is divided into a plurality of portions.

For example, the flexible substrate 100 can be bent, and may adopt a base of a flexible material, such as polyimide (PI), without limited thereto.

For example, in the embodiment of the present disclosure, the antenna includes an NFC antenna, without limited thereto. The antenna may also be a main antenna, Bluetooth, a WIFI antenna and the like. The embodiment of the present disclosure is described with reference to the case where the antenna is an NFC antenna, by way of example.

As illustrated in FIG. 1, the antenna 1021 includes a coil 211. FIG. 1 only illustrates one coil 211, and in other embodiments, the antenna 1021 may include a plurality of coils, which is not limited by the embodiment of the present disclosure. Small space can be occupied in a manner of adopting the coil, and signal enhancement is facilitated.

As illustrated in FIG. 1, the back portion 102 includes a side S1 away from the display portion 101 and a side S2 close to the display portion 101. In order to facilitate signal transmission, the coil 211 may be located at the side of the back portion 102 away from the display portion 101.

As illustrated in FIG. 1, in order to facilitate connection with other parts, the coil 211 includes two connection wires 212, and FIG. 1 illustrates a first connection wire 2121 and a second connection wire 2122 respectively connected with two ends of the coil 211.

Figure 2:
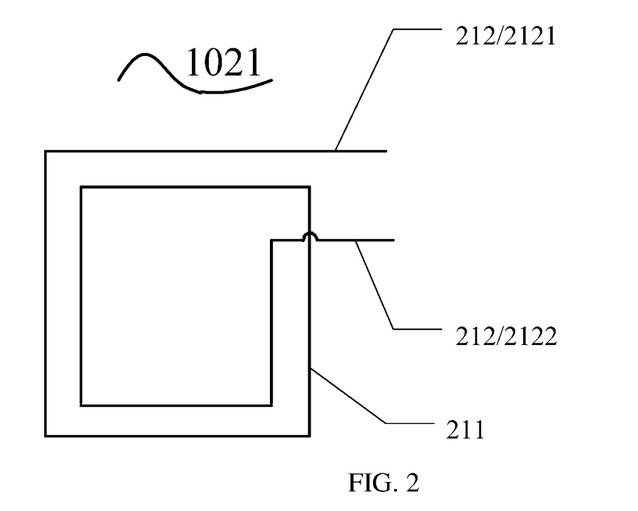
FIG. 2 is a schematic diagram illustrating an antenna in a flexible display device provided by an embodiment of the present disclosure.

FIG. 2 is a schematic diagram illustrating an antenna in a display device provided by an embodiment of the present disclosure. For example, the coil 211 may be located in one layer, and the first connection wire 2121 and the second connection wire 2122 may be arranged in the same layer and located in another layer. The first connection wire 2121 and the second connection wire 2122 may be connected with both ends of the coil 211 through via holes penetrating an insulation layer, respectively.

Figure 3:
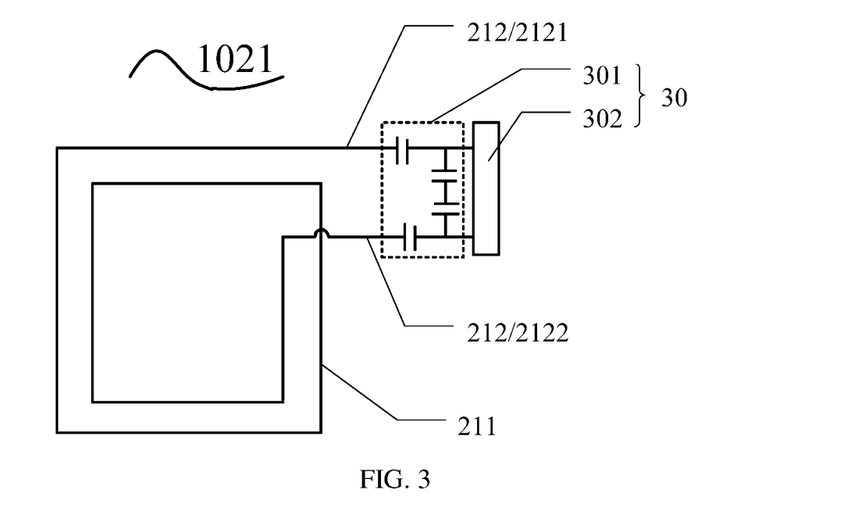
FIG. 3 is a schematic diagram illustrating a connection between an external circuit and an antenna in a flexible display device provided by an embodiment of the present disclosure.

FIG. 3 is a schematic diagram illustrating a connection between an external circuit and an antenna in a display device provided by an embodiment of the present disclosure. As illustrated in FIG. 3, the two connection wires 212 (the first connection wire 2121 and the second connection wire 2122) may be connected with an external circuit 30, respectively, without limited thereto. For example, the external circuit 30 may include a match circuit 301 and a read-write controller 302. For example, the two connection wires 212 are sequentially connected with the match circuit 301 and the read-write controller 302. For example, the match circuit 301 may include a capacitor and/or a resistor, etc. A structure of the match circuit 301 is not limited to that illustrated in FIG. 3. The read-write controller 302 may be configured to perform signal reading and writing and signal processing.

For example, the match circuit 301 and the read-write controller 302 may be integrated in a circuit board, without limited thereto. For example, it may be also that the match circuit 301 is manufactured on the flexible substrate 100, and the read-write controller 302 is integrated in the circuit board. For example, the external circuit 30 may be a flexible printed circuit board, without limited thereto.

In some embodiments, a material of the coil includes metal, for example, at least one selected from the group consisting of molybdenum, silver, aluminum and copper, without limited thereto. In some other embodiments, a material of the coil includes an alloy, for example, an alloy of at least one selected from the group consisting of molybdenum, silver, aluminum and copper, without limited thereto. For example, a material of the connection wire includes metal, e.g., at least one selected from the group consisting of molybdenum, silver, aluminum and copper, without limited thereto. For example, a material of the connection wire includes an alloy, e.g., an alloy of at least one selected from the group consisting of molybdenum, silver, aluminum and copper, without limited thereto.

Figure 4:
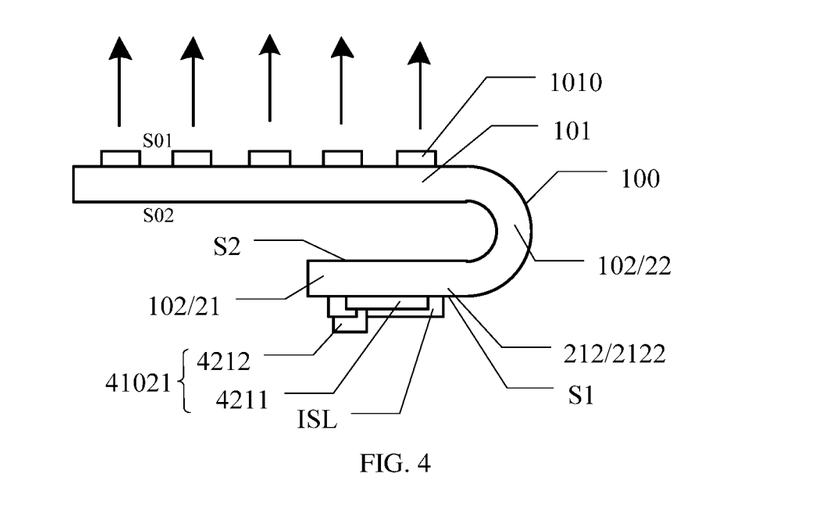
FIG. 4 is a schematic diagram illustrating a flexible display device provided by an embodiment of the present disclosure.

FIG. 4 is a schematic diagram illustrating a display device provided by an embodiment of the present disclosure. FIG. 4 illustrates an antenna 41021. In order to facilitate a connection of the antenna and an external circuit and facilitate signal transmission, the antenna 41021 is provided at a side S1 of the back portion 102 away from the display portion 101. The antenna 41021 includes a coil 4211 and a connection wire 4212 connected with the coil 4211. An insulation layer ISL is provided between the connection wire 4212 and the coil 4211. Of course, the embodiment of the present disclosure is not limited to that illustrated in FIG. 4, and the antenna may also be arranged at a side of the back portion 102 close to the display portion 101. The other end of the coil 4211 in FIG. 4 is connected with another connection wire which is not illustrated in FIG. 4.

The coil 4211 in FIG. 4 is in direct contact with the flexible substrate 100, without limited thereto. A spacer layer may also be arranged between the coil 4211 and the flexible substrate 100, and relevant description will be given in subsequent embodiments.

Figure 5:
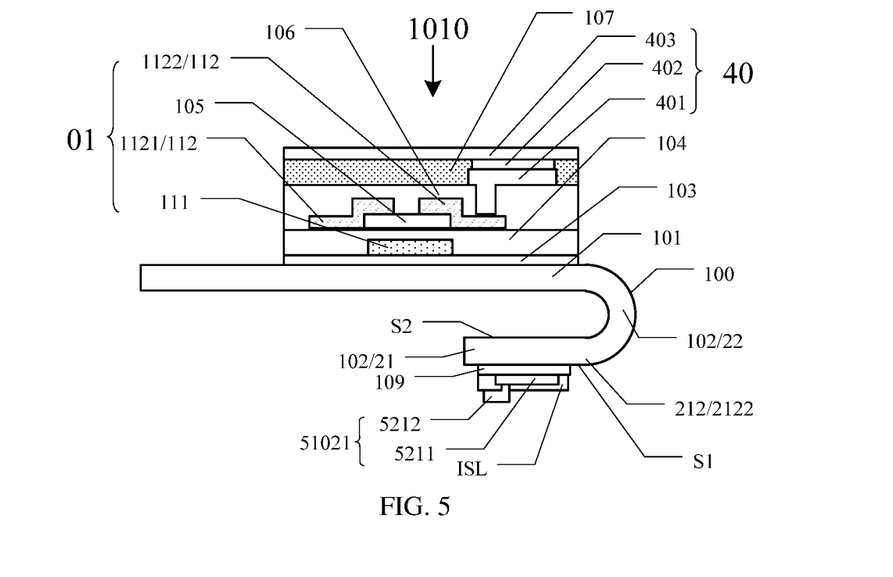
FIG. 5 is a schematic diagram illustrating a flexible display device provided by an embodiment of the present disclosure.

FIG. 5 is a schematic diagram illustrating a display device provided by an embodiment of the present disclosure. Each display unit 1010 includes a Thin Film Transistor (TFT) 01 and a light-emitting unit 40. The TFT 01 includes a gate electrode 111, an active layer 105 and a source-drain electrode layer 112. The source-drain electrode layer 112 includes a source electrode 1121 and a drain electrode 1122. The light-emitting unit 40 may include an OLED, without limited thereto. The light-emitting unit 40 includes a first electrode 401, a second electrode 403 and a functional layer 402 located between the first electrode 401 and the second electrode 403. The functional layer 402 includes a light-emitting layer. The functional layer may also include at least one selected from the group consisting of a hole injection layer, a hole transmission layer, an electron injection layer, an electron transmission layer, etc. The functional layer 402 may be arranged as required. One of the first electrode 401 or the second electrode 403 is a cathode, and the other one of the first electrode 401 or the second electrode 403 is an anode.

As illustrated in FIG. 5, an antenna 51021 includes a coil 5211 and a connection wire 5212 connected with the coil 5211. An insulation layer ISL is provided between the coil 5211 and the connection wire 5212. In order to simplify the process, the coil 5211 and the gate electrode 111 may be manufactured by the same manufacturing process, and the connection wire 5212 and the source-drain electrode layer 112 may be manufactured by the same manufacturing process. The other end of the coil 5211 in FIG. 5 is connected with another connection wire which is not illustrated in FIG. 5. In other embodiments, two coils may also be arranged. For example, a first coil and the gate electrode are manufactured by the same process, and a second coil and the source-drain electrode layer are manufactured by the same process.

In the embodiment of the present disclosure, each display unit may include a plurality of TFTs, a plurality of TFTs of different types may be arranged on the flexible substrate, and an active layer of the TFT may adopt polysilicon, oxide semiconductors, etc., without limited thereto, and may be arranged as required.

FIG. 5 also illustrates a buffer layer 103, a gate electrode insulation layer 104, an active layer 105, an interlayer insulation layer 106 and a pixel definition layer 107. The active layer 105 may include a semiconductor material such as polysilicon or oxide. A spacer layer 109 is further arranged between the coil 5211 and the flexible substrate 100. The spacer layer 109 or the insulation layer ISL may be formed in the same layer as at least one layer on the display portion 101. For example, the spacer layer 109 may be of a layer structure formed in the same layer as at least one selected from the group consisting of the buffer layer 103, the gate electrode insulation layer 104, the active layer 105 and the interlayer insulation layer 106. The insulation layer ISL may include a layer structure formed in the same layer as at least one selected from the group consisting of the buffer layer 103, the active layer 105 and the interlayer insulation layer 106. Of course, the spacer layer 109 and the insulation layer ISL are formed by different layers in the buffer layer 103, the active layer 105 and the interlayer insulation layer 106.

As illustrated in FIG. 5, the spacer layer 109 is provided at a side of the coil 5211 close to the back portion 102, and the coil 5211 is in direct contact with the spacer layer 109. As illustrated in FIG. 5, every part of the coil 5211 is in direct contact with the spacer layer 109. In the case where the antenna includes a plurality of coils, a coil closest to the spacer layer is in direct contact with the spacer layer, without limited thereto. For example, at least one coil is in direct contact with the spacer layer.

Of course, the coil 5211 and the connection wire 5212 may also be manufactured separately, instead of being formed in the same layer as the gate electrode 111 and the source-drain electrode layer 112 that are located on the display portion 101, respectively. Being formed in the same layer may refer to that elements have the same material and prepared by the same preparation process. A manner for manufacturing the antenna separately is favorable for pattern manufacturing of the back portion. When manufactured separately, the antenna may be made of a high temperature resistant metal material such as molybdenum (Mo).

For example, when the coil is manufactured separately, the method includes forming a high temperature resistant metal material layer firstly, and then forming the coil of the antenna by a photolithography process and an etching process. When the coil of the antenna is manufactured separately, a high conductivity material such as a nanometer silver adhesive material may also be adopted for manufacturing. For example, the coil may be formed in patterning manners such as a photolithography process and a screen printing process. When the connection wire is manufactured separately, a manufacturing method of the coil may be referred to, which is not repeated herein.

Figure 6A:
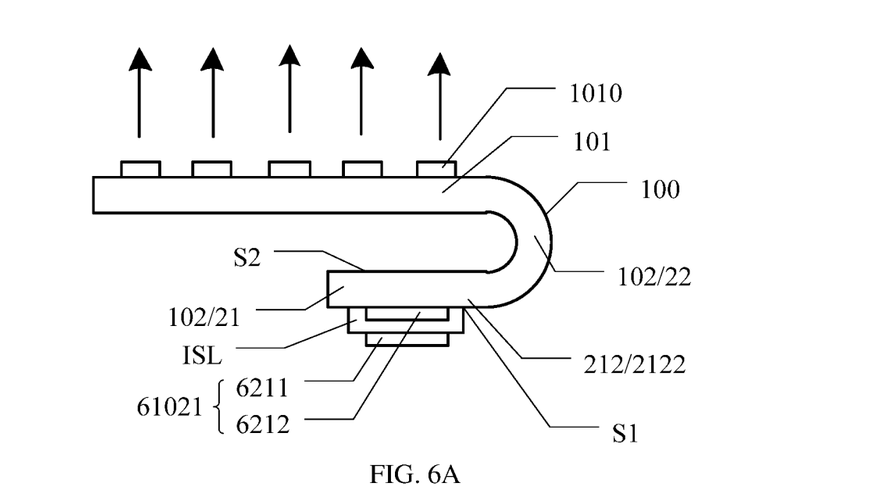
FIG. 6A is a schematic diagram illustrating a flexible display device provided by an embodiment of the present disclosure.

FIG. 6A is a schematic diagram illustrating a display device provided by an embodiment of the present disclosure. An antenna 61021 is located on a back portion 102 of a flexible substrate 100. The antenna 61021 includes a first coil 6211 ad a second coil 6212. The first coil 6211 and the second coil 6212 are located on the back portion 102 of the flexible substrate 100. For example, the first coil 6211 and the second coil 6212 may be respectively manufactured by adopting a high temperature resistant material. For example, a connection wire of the first coil 6211 or a connection wire of the second coil 6212 may be formed of the same material layer as that of the gate electrode through the same process as that of the gate electrode, or be formed of the same material layer as that of the source-drain electrode layer through the same process as that of the source-drain electrode layer. The connection wire of the first coil 6211 and the connection wire of the second coil 6212 may be arranged in the same layer so as to facilitate a connection with an external circuit.

Figure 6B:
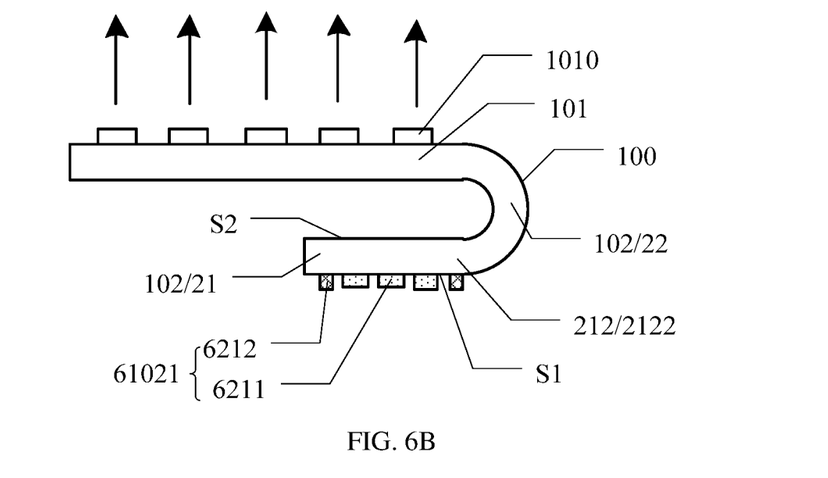
FIG. 6B is a schematic diagram illustrating a flexible display device provided by an embodiment of the present disclosure.

FIG. 6B is a schematic diagram illustrating a display device provided by an embodiment of the present disclosure. Compared with FIG. 6A, in the display device illustrated in FIG. 6B, the first coil 6211 and the second coil 6212 are located in the same layer and may be formed by the same patterning process.

Figure 7:
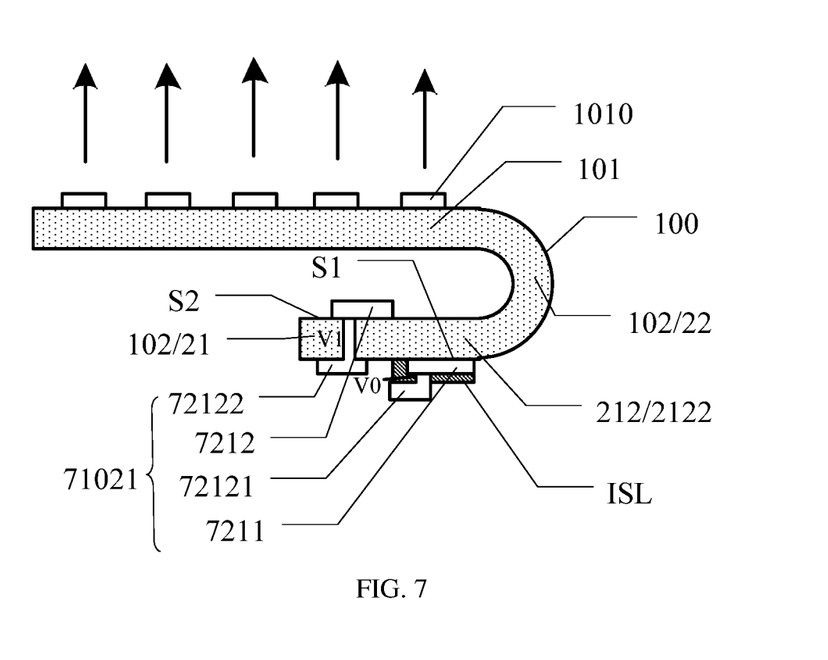
FIG. 7 is a schematic diagram illustrating a flexible display device provided by an embodiment of the present disclosure.

FIG. 7 is a schematic diagram illustrating a display device provided by an embodiment of the present disclosure. As illustrated in FIG. 7, an antenna 71021 is located on a back portion 102 of a flexible substrate. The antenna 71021 includes a first coil 7211 and a second coil 7212. The first coil 7211 is located at a side S1 of the back portion 102 away from the display portion 101, and the second coil 7212 is located at a side S2 of the back portion 102 close to the display portion 101. One end of the first coil 7211 is connected with a connection wire 72121, and the other end of the first coil 7211 is connected with another connection wire which is not illustrated in FIG. 7 (which may refer to FIG. 8). The back portion has a via hole V1, a connection wire 72122 is connected with the second coil 7212 through the via hole V1, and another connection wire is connected with the other end of the second coil 7212 through a via hole penetrating the back portion 102. One end of the first coil 7211 is connected with the connection wire 72121 through a via hole V0 penetrating the insulation layer ISL, and the other end of the first coil 7211 is connected with another connection wire which is not illustrated in FIG. 7 (which may refer to FIG. 8). For example, the via hole V0 penetrating the insulation layer ISL and a via hole formed on the display portion 101 are formed by the same process, without limited thereto.

Figure 8:
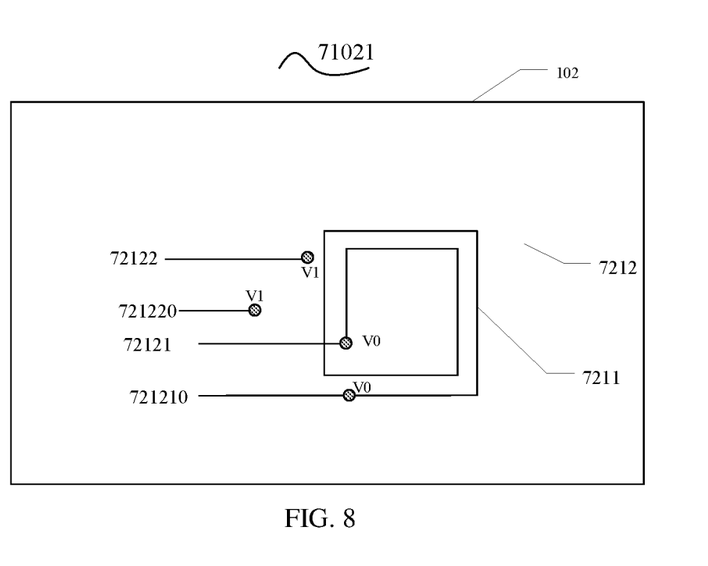
FIG. 8 is a bottom view illustrating an antenna in a display device provided by an embodiment of the present disclosure.

FIG. 8 is a bottom view illustrating an antenna in a display device provided by an embodiment of the present disclosure. FIG. 8 may be a bottom view illustrating the back portion in FIG. 7. FIG. 8 illustrates two via holes V1 penetrating the back portion 102 and two via holes V0 penetrating the insulation layer ISL.

The first coil 7211 and the second coil 7212 illustrated in FIG. 8 are arranged at two sides of the back portion 102, respectively. In the case where the two coils are both located at the side of the back portion 102 away from the display portion, the via hole V1 penetrating the back portion 102 may not be arranged, a connection between the coil and the connection wire is achieved through the via hole penetrating the insulation layer located at the side of the back portion 102 away from the display portion. In the case where the two coils are located at the same side of the curved portion 102, the two coils may be located in the same layer, and may be formed by the same patterning process. In the case where the two coils are located at the same side of the curved portion 102, an insulation layer may not be provided between the two coils, without limited thereto.

As illustrated in FIG. 8, one end of the first coil 7211 is connected with the connection wire 72121, and the other end of the first coil 7211 is connected with a connection wire 721210. One end of the first coil 7211 is connected with the connection wire 72121, and the other end of the first coil 7211 is connected with the connection wire 721210. The connection wires of the two coils may be located in the same layer and may be formed by the same patterning process.

For example, the antenna may include an inner coil and an outer coil so as to facilitate performance adjustment, reduce process complexity and facilitate signal transmission and reception. The inner coil may serve as a main coil, and the outer coil may serve as an auxiliary coil. Of course, if only cost is considered, only one coil may be formed. As illustrated in FIG. 8, the first coil 7211 is the inner coil, and the second coil 7212 is the outer coil. Of course, in the case where the antenna includes a plurality of coils, it is not limited to a type of the inner coil and the outer coil.

As illustrated in FIG. 7 and FIG. 8, the connection wire 72121 and the connection wire 72122 may be formed in the same layer, and are located at a side S1 of the back portion 102 away from the display portion 101.

In the case where the plurality of coils and the plurality of connection wires are located at the same side of the back portion, the plurality of coils are located in a first layer, the plurality of connection wires are located in a second layer, and an insulation layer may be arranged between the first layer and the second layer.

Figure 9:
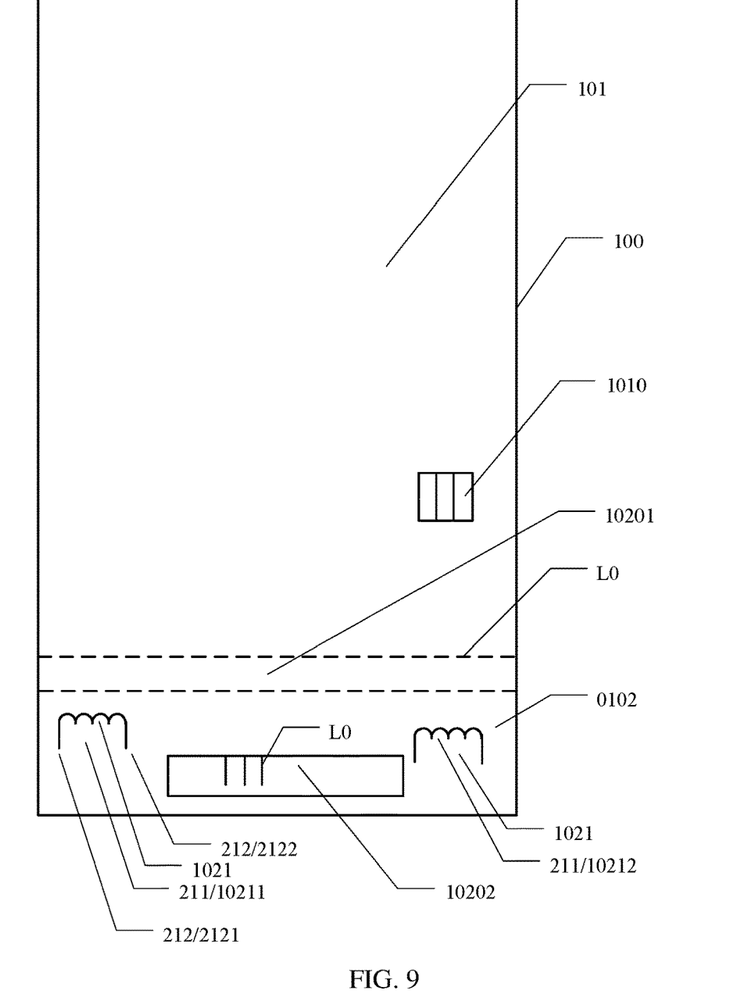
FIG. 9 is a top view illustrating a flexible display device provided by an embodiment of the present disclosure before being bent.

FIG. 9 is a top view illustrating a display device provided by an embodiment of the present disclosure before being bent. As illustrated in FIG. 9, the flexible substrate 100 includes a display portion 101 and a first portion 0102. The first portion 0102 is outside the display portion 101. The first portion 0102 is a portion of the flexible substrate 100 to form a back portion. The first portion 0102 is the back portion 102 before being bent.

As illustrated in FIG. 9, the display portion 101 includes a plurality of display units 1010, only three display units 1010 are exemplarily illustrated in FIG. 9, and a number of the display units 1010 is not limited to that illustrated in FIG. 9. The plurality of display units 1010 may include a plurality of rows and columns to be distributed in an array. The first portion 0102 includes a region 10201 to-be-bent and a pad region 10202. For example, the region 10201 to-be-bent corresponds to a connection portion after a bending process. FIG. 9 illustrates the case where the antenna 1021 includes two coils 211, namely a coil 10211 and a coil 10212. For example, two ends of each coil are each connected with a connection wire. FIG. 9 illustrates a bending line L0. The display device may be bent according to the bending line L0.

As illustrated in FIG. 9, the first portion 0102 includes the pad region 10202, and the antenna 1021 may be arranged in a region of the first portion 0102 outside the pad region 10202. For example, as illustrated in FIG. 9, the pad region 10202 includes a plurality of leads L0 respectively connected with the plurality of display units 1010, and the antenna 1021 is located in a region to form the back portion, except the pad region 10202. For example, the two coils 10211 and 10212 are arranged at two opposite sides of the pad region 10202, respectively. For example, as illustrated in FIG. 9, the coil 10211 is located at a left side of the pad region 10202, and the coil 10212 is located at a right side of the pad region 10202. FIG. 9 illustrates three leads L0, and a number of the leads L0 may be arranged as required. For example, one lead L0 may be connected with one display unit 1010.

At least one embodiment of the present disclosure further provides a manufacturing method of a display device, which includes: forming an antenna in a first portion of a flexible substrate, the first portion being a portion to form a back portion of the flexible substrate, the flexible substrate including a display portion, the display portion including a display side and a back side opposite to the display side; and bending a portion of the flexible substrate located between the display portion and the first portion so that the first portion is bent to the back side of the display portion to form the back portion.

Figure 10:
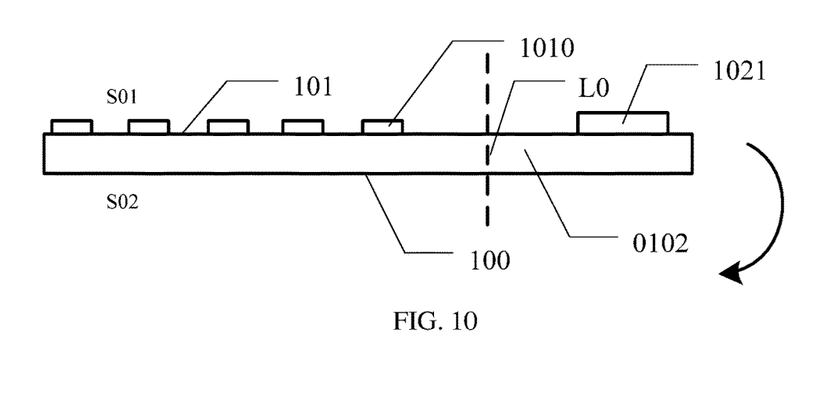
FIG. 10 is a schematic diagram illustrating a manufacturing method of a flexible display device provided by at least one embodiment of the present disclosure.

FIG. 10 is a schematic diagram illustrating a manufacturing method of a display device provided by at least one embodiment of the present disclosure. As illustrated in FIG. 10, the method includes: forming a plurality of display units 1010 on a display portion 101 of a flexible substrate, the display portion 101 including a display side S01 and a back side S02 opposite to the display side S01; forming an antenna 1021 on a first portion 0102 of the flexible substrate 100 except the display portion 101, the first portion 0102 being a portion of the flexible substrate 10 to form a back portion 102 (FIG. 10 does not illustrate the back portion 102, which may refer to FIG. 1); and bending a portion of the flexible substrate 100 located between the display portion 100 and the first portion 0102 so that the first portion 0102 is bent to the back side S02 of the display portion 101 to form the back portion 102 (FIG. 10 does not illustrate the back portion 102, which may refer to FIG. 1). An arrow illustrated in FIG. 10 refers to a bending direction. That is, the first portion 0102 provided with the antenna 1021 is bent to the back side S02 of the display portion 101 to form the back portion 102. For example, a structure of the display device formed after a bending process may refer to the description of the previous embodiment.

Figure 11:
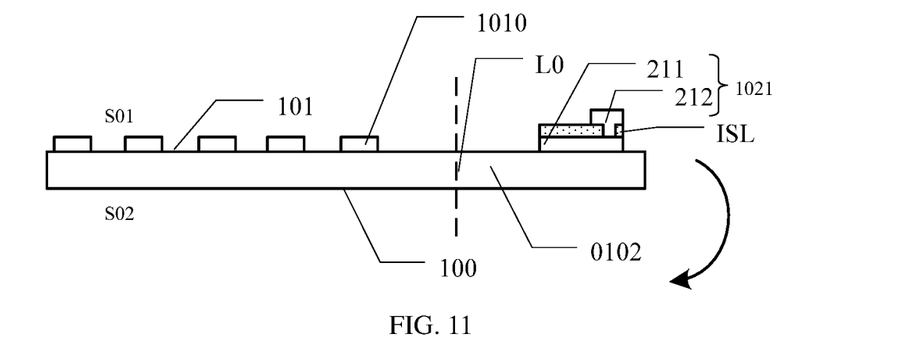
FIG. 11 is a schematic diagram illustrating a manufacturing method of a flexible display device provided by an embodiment of the present disclosure.

FIG. 11 is a schematic diagram illustrating a manufacturing method of a display device provided by an embodiment of the present disclosure. As illustrated in FIG. 11, the antenna 1021 and a plurality of display units 1010 are formed at the same side of the flexible substrate 100, so that after the flexible substrate 100 is bent, at least one coil 211 of the antenna 1021 is formed at a side S1 of the back portion 101 away from the display portion 101.

For example, a coil is formed in a region to be bent to a back side of a display portion by depositing a high temperature resistant metal material layer and then performing a photolithography process and an etching process. A high temperature resistant metal material includes molybdenum (Mo), without limited thereto. A manufacturing manner of the coil is not limited to the described manner, either.

Figure 12:
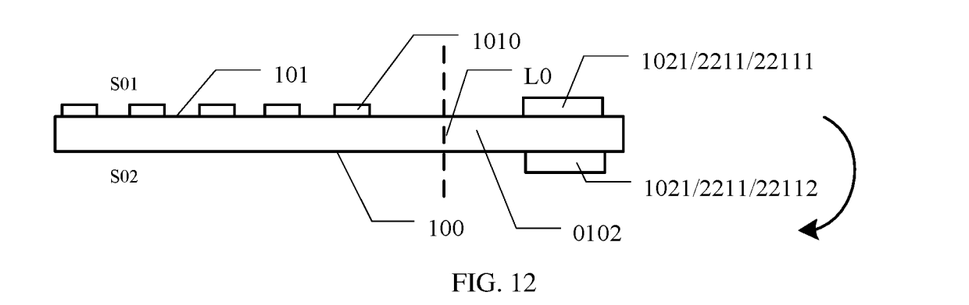
FIG. 12 is a schematic diagram illustrating a manufacturing method of a flexible display device provided by an embodiment of the present disclosure.

FIG. 12 is a schematic diagram illustrating a manufacturing method of a display device provided by an embodiment of the present disclosure. As illustrated in FIG. 12, forming the antenna 1021 on the first portion 0102 includes: respectively forming two coils 2211 at two sides of the first portion 0102, namely, a first coil 22111 and a second coil 22112.

Figure 13:
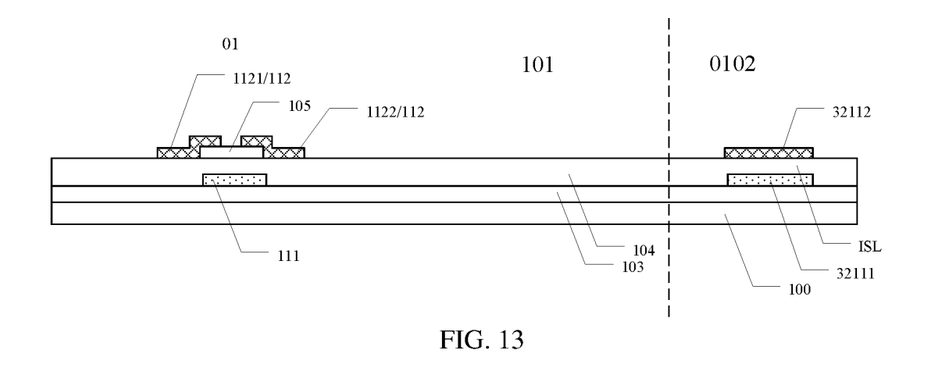
FIG. 13 is a schematic diagram illustrating a manufacturing method of a flexible display device provided by an embodiment of the present disclosure.

FIG. 13 is a schematic diagram illustrating a manufacturing method of a display device provided by an embodiment of the present disclosure. As illustrated in FIG. 13, forming the antenna 1021 on the first portion 0102 includes: forming two coils 32111 and 32112 at the same side of the first portion 0102, and forming an insulation layer ISL between the two coils 32111 and 32112.

Figure 14A:
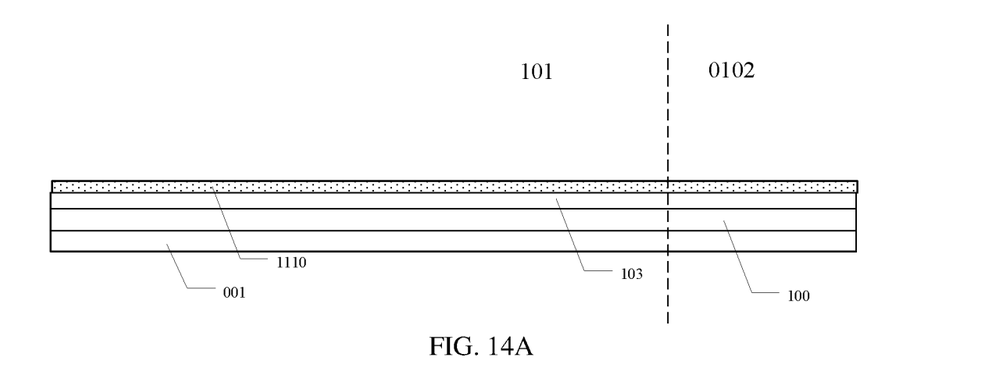
FIGS. 14A-14C are schematic diagrams illustrating a manufacturing method of a flexible display device provided by an embodiment of the present disclosure.
Figure 14B:
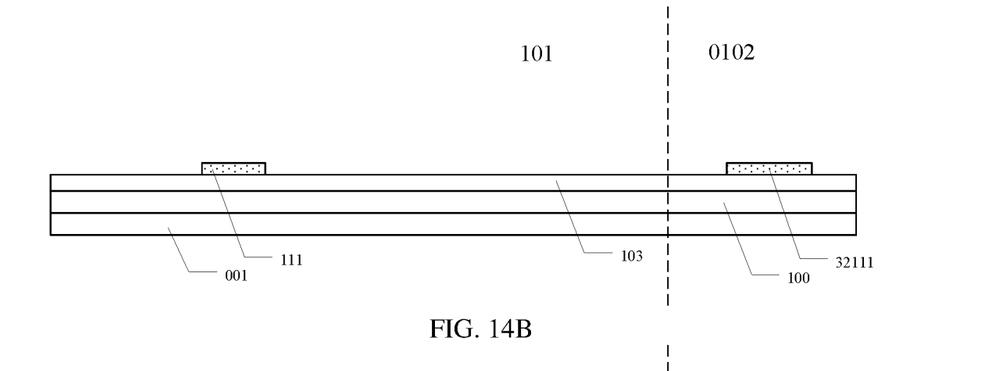
Figure 14C:
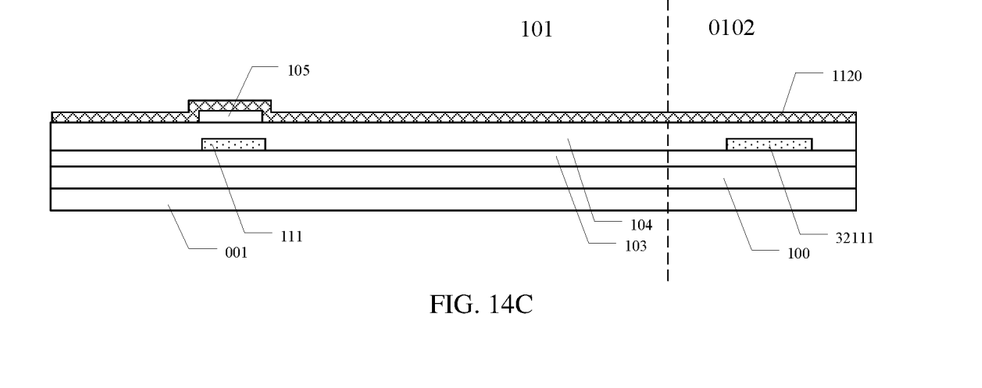

FIGS. 14A-14C are schematic diagrams illustrating a manufacturing method of a display device provided by an embodiment of the present disclosure. In combination with FIG. 13 and FIGS. 14A-14C, forming the plurality of display units 1010 on the display portion 101 includes forming a gate electrode 111 and a source-drain electrode layer 112 of a TFT 01 of each display unit 1010 on the display portion 101, the source-drain electrode layer 112 including a source electrode 1121 and a drain electrode 1122; and forming the antenna 1021 on the first portion 0102 includes forming a coil 32111 and a coil 32112 on the first portion 0102.

For example, forming the gate electrode 111 and the source-drain electrode layer 112 on the display portion 101 and forming the coil 32111 and the coil 32112 on the first portion 0102 includes following steps.

As illustrated in FIG. 14A, placing a flexible substrate 100 on a hard substrate 001 and forming a gate electrode material layer 1110 on a display portion 101 and on a first portion 0102 of the flexible substrate 100.

As illustrated in FIG. 14B, patterning the gate electrode material layer 1110 to form the gate electrode 111 on the display portion 101 and form the coil 32111 on the first portion 0102.

As illustrated in FIG. 14C, sequentially forming a gate electrode insulation layer 104, an active layer 105 and a source-drain electrode material layer 1120 on the gate electrode 111 and on the coil 32111, the active layer 105 being located right above the gate electrode 111.

Patterning the source-drain electrode material layer 1120 to form the source-drain electrode layer 112 on the display portion 101 and form the coil 32112 on the first portion 0102, a formed structure is as illustrated in FIG. 13.

As illustrated in FIG. 13 and FIGS. 14A-14C, the gate electrode 111 and the coil 32111 are formed by the same process, the source-drain electrode layer 112 and the coil 32112 are formed by the same process, and a forming manner by the same process may reduce process complexity and lower the cost.

In the embodiment of the present disclosure, after the TFT is formed, a planarization layer (PLN), a first electrode, a pixel definition layer (PDL), a second electrode and other film layers may continue to be formed. One of the first electrode or the second electrode may be a cathode, and the other one of the first electrode or the second electrode may be an anode. For example, after the display unit and the antenna are manufactured, the flexible substrate may be bent.

Figure 15:
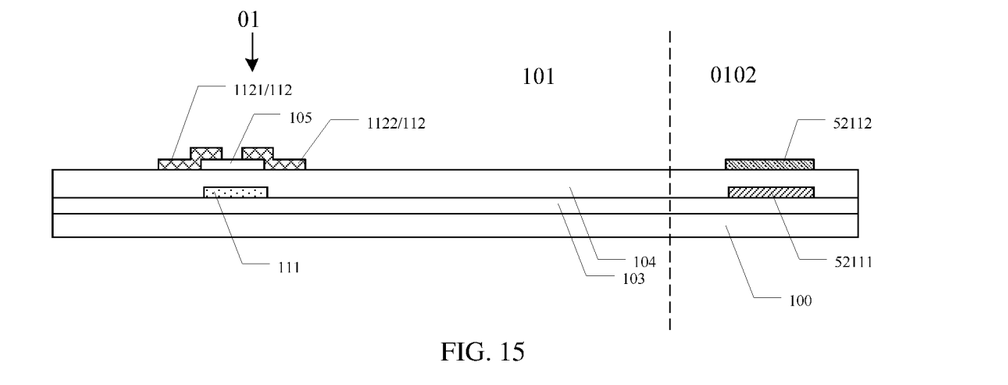
FIG. 15 is a schematic diagram illustrating a manufacturing method of a flexible display device provided by an embodiment of the present disclosure.

FIG. 15 is a schematic diagram illustrating a manufacturing method of a display device provided by an embodiment of the present disclosure. As illustrated in FIG. 15, a coil 52111 and a coil 52112 are manufactured by separate processes, instead of being formed by the same manufacturing process as that of part of the film layers of the display portion 101 as illustrated in FIG. 13. For example, the coil may be formed using a separate mask or by a separate patterning process. A coil on the first portion 0102 is separately manufactured, which may facilitate formation of the coil pattern.

FIGS. 16A-16D are schematic diagrams illustrating a manufacturing method of a display device provided by an embodiment of the present disclosure. As illustrated in FIGS. 16A-16D, forming the antenna 1021 on the first portion 0102 further includes following steps.

Figure 16A:
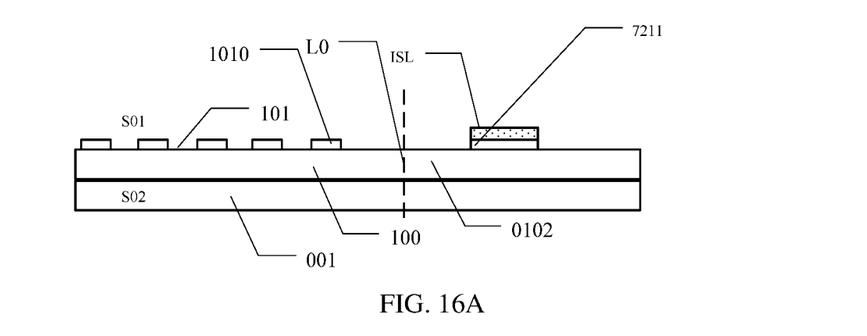
FIGS. 16A-16D are schematic diagrams illustrating a manufacturing method of a flexible display device provided by an embodiment of the present disclosure.

As illustrated in FIG. 16A, placing a flexible substrate 100 on a hard substrate 001, and forming a first antenna 7211 and an insulation layer ISL on the first portion 0102 of the flexible substrate 100.

Figure 16B:
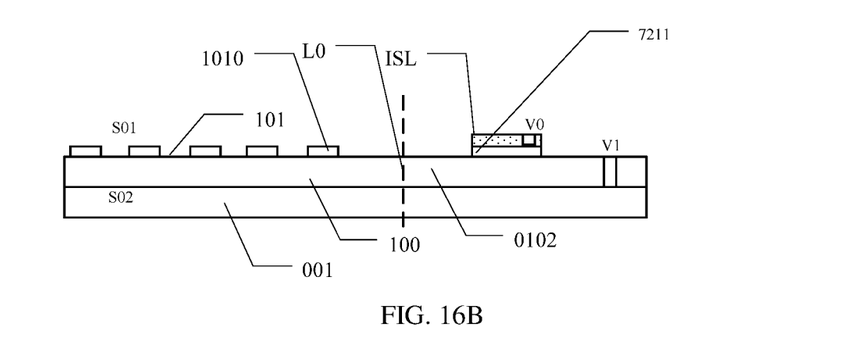

As illustrated in FIG. 16B, forming a via hole V1 penetrating the first portion 0102 and a via hole V0 penetrating the insulation layer ISL.

Figure 16C:
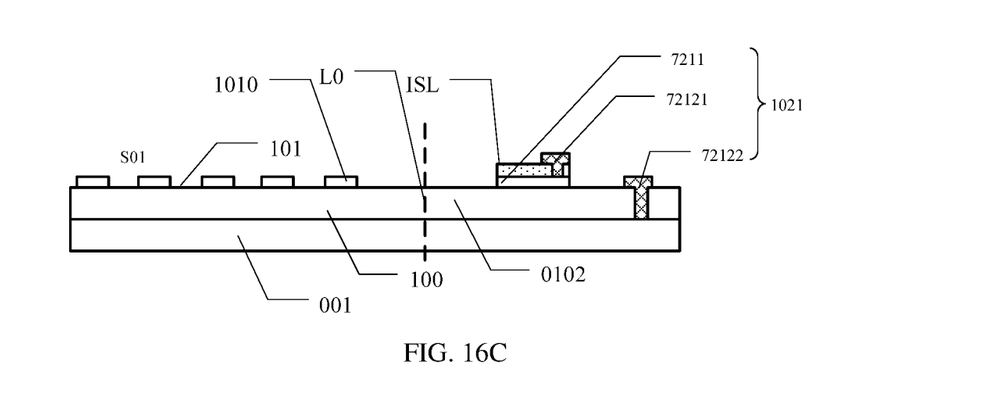

As illustrated in FIG. 16C, forming a connection wire 72121 and a connection wire 72122 that are located in the same layer.

Figure 16D:
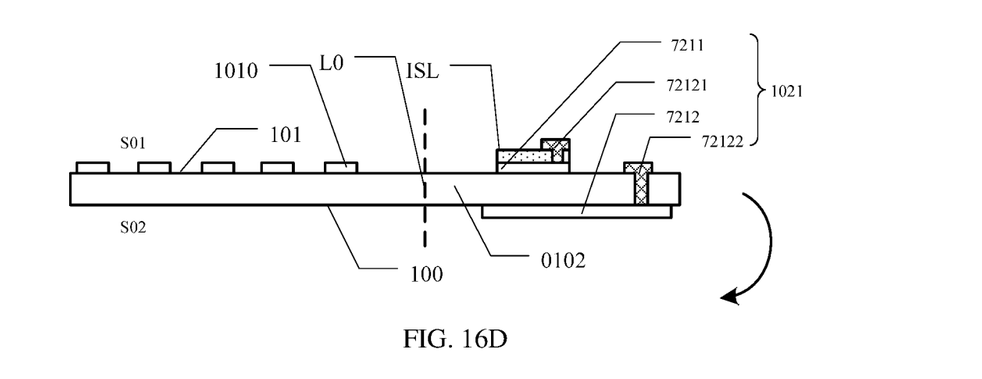

As illustrated in FIG. 16D, after taking the flexible substrate 100 away from the hard substrate 001, forming a second coil 7212 on a side of the first portion 0102 opposite to a side where the first coil 7211 is formed. The connection wire 72121 is connected with one end of the first coil 7211, and the connection wire 72122 is connected with one end of the second coil 7212.

The other end of the first coil 7211 is connected with a connection wire 721210, and the other end of the second coil 7212 is connected with a connection wire 721220, which may refer to that illustrated in FIG. 8. For example, the connection wire 721210, the connection wire 72121, the connection wire 721220 and the connection wire 72122 are located in the same layer.

The connection wire 721210 is connected with the other end of the first coil 7211 through the via hole V0 penetrating the insulation layer ISL. The connection wire 721220 is connected with the other end of the second coil 7212 through the via hole V1 penetrating the first portion 0102, which may refer to that illustrated in FIG. 8.

After the flexible substrate as illustrated in FIG. 16D is bent, the display device as illustrated in FIG. 7 may be formed. A structure of the antenna may refer to that illustrated in FIG. 8.

FIGS. 16A-16D only illustrate the connection wire 72121 and the connection wire 72122. Description of respective connection between the two connection wires and two ends of the coil may refer to that illustrated in FIG. 8.

In FIGS. 16A-16D, the antenna located on the first portion 0102 may be manufactured separately, or may be formed by the same process as that of a part of the film layers of the display unit 1010 on the display portion 101. The previous description may be referred to for details, without repeated herein.

In other embodiments, manufacturing may also be performed in other manners. The method includes normally completing processes of a backplane, evaporation and the like; coating a conductive nanometer Ag glue or other high conductivity materials in a predetermined region according to a predetermined shape when performing a module glue coating, and forming a coil from the high conductivity material.

In order to make the coil have good conductivity, a thickness of the conductive material layer forming the coil cannot be lower than 10 microns. For example, a thickness of the coil is greater than or equal to 15 microns.

For example, after a bending process is completed, the connection wire of the coil is exposed to facilitate connection with an external circuit.

In the embodiment of the present disclosure, the manufacturing method may also include connecting the external circuit with the connection wire of the coil. For example, a bonding process may be performed. For example, when the leads of the various display units on the display portion located in the pad region are bonded to a display circuit board, bonding of an external circuit board and the connection wire of the coil is synchronously performed, without limited thereto. The display circuit board and the external circuit board of the antenna may be integrated in one circuit board.

It should be noted that, for the purpose of clarity, in accompanying drawings for illustrating the embodiment(s) of the present disclosure, the thickness and size of a layer or a structure may be enlarged. However, it should be understood that, in the case where a component or element such as a layer, film, region, substrate or the like is referred to be "on" or "under" another component or element, it may be directly on or under the another component or element or a component or element is interposed therebetween.

In the embodiments of the present disclosure, a patterning or a patterning process may include only a photolithography process, or include a photolithography process and an etching process, or include other processes to form a predetermined pattern such as a printing process, and an inkjet process. A photolithography process includes forming a pattern by processes such as film forming, exposure, and development etc., by using photoresist, mask, exposure machine etc. A corresponding patterning process may be selected according to the structure formed by the embodiment of the present disclosure.

In the embodiments of the present disclosure, "same layer" may refer to that the same film forming process is adopted for forming a film layer for forming a predetermined pattern, and then the same mask is used for forming a layer structure by a one-time patterning process. According to the difference of the predetermined patterns, the one-time patterning process may include multi-time exposing, developing or an etching process, the predetermined patterns in the formed layer structure may be continuous or discontinuous, and the predetermined patterns may also be located at different heights or have different thicknesses. In the case where a first component on the display portion and a second component on the back portion are arranged in the same layer or formed in the same layer, it refers to that the first component on the display portion and the second component on the first portion of the flexible substrate are formed by the same patterning process before the flexible substrate being bent.

In case of no conflict, features in one embodiment or in different embodiments may be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display device, comprising:
   a flexible substrate, comprising a display portion and a back portion that are connected with each other, the display portion comprising a display side and a back side opposite to the display side, the back portion being located at the back side of the display portion; and
   an antenna, located on the back portion,
   wherein the antenna comprises at least one coil, the at least one coil comprises a first coil and a second coil located at a same side of the back portion, the display device further comprises a plurality of display units located on the display portion, wherein each of the plurality of display units comprises a thin film transistor, the thin film transistor comprises a gate electrode and a source-drain electrode layer, one of the first coil and the second coil is made of a same material as that of the gate electrode through a same process as that of the gate electrode, and the other one of the first coil and the second coil is made of a same material as that of the source-drain electrode layer through a same process as that of the source-drain electrode layer, and an insulation layer is provided between the first coil and the second coil.

2. The display device according to claim 1, wherein the flexible substrate further comprises a curved portion, the display portion is connected with the back portion by the curved portion, and the display portion, the curved portion and the back portion constitute an integral structure.

3. The display device according to claim 1, wherein the at least one coil is located at a side of the back portion away from the display portion.

4. The display device according to claim 1, wherein the at least one coil is in direct contact with the flexible substrate.

5. The display device according to claim 1, wherein a spacer layer is provided at a side of the at least one coil close to the back portion, and the at least one coil is in direct contact with the spacer layer.

6. The display device according to claim 5, wherein the spacer layer is made from at least one selected from the group consisting of an insulation material and a semiconductor material.

7. The display device according to claim 1, wherein the back portion further comprises a pad region, the pad region comprises a plurality of leads connected with the plurality of display units respectively, and the antenna is located in a region of the back portion except the pad region.

8. The display device according to claim 7, wherein the first coil and the second coil are arranged at two opposite sides of the pad region, respectively.

9. The display device according to claim 1, wherein the antenna further comprises two connection wires connected with two ends of a same coil of the at least one coil, respectively, and the two connection wires are configured to be connected with an external circuit.

10. The display device according to claim 9, wherein the two connection wires and the same coil are located at a same side of the back portion.

11. The display device according to claim 9, wherein the back portion comprises two via holes, the two connection wires are arranged in a same layer, the same coil or the two connection wires are located at a side of the back portion close to the display portion, the two connection wires or the same coil is located at a side of the back portion away from the display portion, and the two connection wires are connected with two ends of the same coil through the two via holes, respectively.

12. A manufacturing method of a display device, comprising:

forming an antenna on a first portion of a flexible substrate, the first portion being a portion of the flexible substrate to form a back portion, the flexible substrate comprising a display portion, the display portion comprising a display side and a back side opposite to the display side; and bending a portion of the flexible substrate located between the display portion and the first portion so that the first portion is bent to the back side of the display portion to form the back portion, further comprising: forming at least one coil on the first portion, and forming a plurality of display units on the display portion of the flexible substrate, wherein the at least one coil and the plurality of display units are formed at a same side of the flexible substrate before being bent, wherein forming the plurality of display units on the display portion comprises forming a gate electrode and a source-drain electrode layer of a thin film transistor of each of the plurality of display units on the display portion, and forming the antenna on the first portion comprises forming a first coil and a second coil on the first portion, forming the gate electrode and the source-drain electrode layer on the display portion and forming the first coil and the second coil on the first portion comprises:

forming a gate electrode material layer on the display portion and on the first portion of the flexible substrate;

patterning the gate electrode material layer to form the gate electrode on the display portion and form the first coil on the first portion;

forming a gate electrode insulation layer on the gate electrode and on the first coil;

forming a source-drain electrode material layer on the gate electrode insulation material layer; and patterning the source-drain electrode material layer so as to form the source-drain electrode layer on the display portion and form the second coil on the first portion.

13. The manufacturing method according to claim 12, wherein forming the antenna on the first portion further comprises: forming two connection wires located in a same layer on the first portion;

forming the first coil and the second coil on the first portion and forming the two connection wires on the first portion comprises:

forming two via holes penetrating the first portion;

forming the two connection wires on the first portion; and forming the first coil at a side of the first portion opposite to a side where the two connection wires are formed, the two connection wires being connected with two ends of the first coil, respectively.

* * * * *